(12) United States Patent
Lee et al.

(10) Patent No.: US 9,231,371 B2
(45) Date of Patent: Jan. 5, 2016

(54) WAVELENGTH-TUNABLE OPTICAL TRANSMISSION APPARATUS

(71) Applicant: Electronics and Telecommunications Research Institute, Daejeon-si (KR)

(72) Inventors: Jyung-Chan Lee, Daejeon-si (KR); Eun-Gu Lee, Daejeon-si (KR); Sil-Gu Mun, Daejeon-si (KR); Eui-Suk Jung, Daejeon-si (KR); Sang-Soo Lee, Daejeon-si (KR)

(73) Assignee: ELECTRONICS AND TELECOMMUNICATIONS RESEARCH INSTITUTE, Daejeon-Si (KR)

( * ) Notice: Subject to any disclaimer, the term of this patent is extended or adjusted under 35 U.S.C. 154(b) by 0 days.

(21) Appl. No.: 14/077,863

(22) Filed: Nov. 12, 2013

(65) Prior Publication Data
US 2014/0133502 A1    May 15, 2014

(30) Foreign Application Priority Data

Nov. 12, 2012    (KR) .................. 10-2012-0127587
Nov. 12, 2013    (KR) .................. 10-2013-0136874

(51) Int. Cl.
| H01S 3/10 | (2006.01) |
| H01S 5/06 | (2006.01) |
| H01S 5/40 | (2006.01) |
| H04B 10/50 | (2013.01) |
| H01S 5/042 | (2006.01) |

(52) U.S. Cl.
CPC ............ H01S 5/0612 (2013.01); H01S 5/4087 (2013.01); H04B 10/506 (2013.01); *H01S 5/042* (2013.01)

(58) Field of Classification Search
CPC ..... H01S 5/4087; H01S 5/4012; H01S 5/005; H01S 5/0687; H01S 3/09408; H01S 5/02284; H01S 5/02415; H01S 5/026; H01S 5/12; H01S 5/4062; H01S 2301/03; H01S 3/06733; H01S 3/0675
USPC .......................................................... 372/20
See application file for complete search history.

(56) References Cited

U.S. PATENT DOCUMENTS

| 7,079,720 | B2 * | 7/2006 | Kish et al. ........................ 385/14 |
| 7,809,037 | B2 * | 10/2010 | Hoashi et al. ............... 372/38.02 |
| 7,826,509 | B2 * | 11/2010 | Belkin et al. .............. 372/50.122 |
| 8,320,763 | B2 | 11/2012 | Kim et al. |
| 8,428,091 | B2 | 4/2013 | Park et al. |
| 2008/0219303 | A1 * | 9/2008 | Chen et al. ....................... 372/23 |
| 2011/0102537 | A1 * | 5/2011 | Griffin et al. ................. 347/237 |
| 2013/0129357 | A1 * | 5/2013 | Belnap et al. ................. 398/106 |

FOREIGN PATENT DOCUMENTS

| KR | 10-2009-0106382 A | 10/2009 |
| KR | 10-2010-0001486 A | 1/2010 |
| KR | 10-2011-0073232 A | 6/2011 |

* cited by examiner

*Primary Examiner* — Xinning Niu
*Assistant Examiner* — Vu A Vu
(74) *Attorney, Agent, or Firm* — Rabin & Berdo, P.C.

(57) ABSTRACT

A wavelength-tunable optical transmission apparatus including an optical array unit comprising a plurality of light sources whose wavelengths are changed, an optical driving unit configured to receive an electrical signal transmitted from an external circuit, generate the current and input the generated current to the optical array unit, and a control unit configured to control the magnitude of current input to the optical array unit by controlling the optical driving unit.

11 Claims, 5 Drawing Sheets

WAVELENGTH-TUNABLE OPTICAL TRANSMISSION APPARATUS

CROSS-REFERENCE TO RELATED APPLICATION

This application claims priority from Korean Patent Application Nos. 10-2012-0127587, filed on Nov. 12, 2012, and 10-2013-0136874, filed on Nov. 12, 2013, in the Korean Intellectual Property Office, the entire disclosures of which are incorporated herein by references for all purposes.

BACKGROUND

1. Field

The following description relates to an optical transmission apparatus, and more particularly, to an optical transmission apparatus capable of tuning a wavelength using a plurality of light sources.

2. Description of the Related Art

Fiber to the Home (FTTH) based on Wavelength Division Multiplexing (WDM), that is, a wavelength division multiplexing-passive optical network (WDM-PON), is a communication scheme in which communication between a central base station and subscribers is achieved using a unique wavelength designated for each subscriber. Such a communication scheme provides each subscriber with a large capacity communication service that is independent and secure. In addition, the WDM-based communication scheme, which is distinguished from a time division multiplexing (TDM) scheme, performs light source modulation/demodulation for every single subscriber, so the bandwidth provided to each subscriber does not change when the number of subscribers increases.

In order to implement such a WDM-PON, light sources having a number of wavelengths corresponding to the number of subscribers are needed. Accordingly, the use of a broadband wavelength-tunable light source for colorless characteristics is a key point to resolve an inventory issue (a difficulty in managing an inventory of light sources when a fixed-wavelength light source is used and a n-channel providing system requires a total of n light sources).

A conventional wavelength-tunable light source uses a method for forming a resonance outside a gain medium and physically controlling a reflection wavelength or the distance of a resonator, such as in a planar lightwave circuit (PLC)-external cavity laser (ECL) and microelectromechanical systems (MEMs). An example of a wavelength-tunable light source using a PLC-ECL device is disclosed in Korean Patent Laid-Open Publication 10-2009-0106382, and an example of a thermally actuated wavelength-tunable light source provided in the form of MEMs is disclosed in Korean Patent Application No. 10-2008-0061394.

However, while such a conventional wavelength-tunable light source can be tuned to a wide range of wavelengths, it is costly and its safety cannot be guaranteed.

In recent years, to overcome these drawbacks, a wavelength-tunable light source that achieves a wavelength tuning through temperature change by including a temperature controller that changes the temperature of a laser array is emerging. An example of such a wavelength-tunable light source includes a conventional wavelength-tunable laser light source module (Korean Patent Laid-Open Publication 10-2011-0073232).

The conventional wavelength-tunable laser light source module includes a laser array to emit an optical signal having a plurality of lasing wavelengths and a temperature controller to change the temperature of the laser array.

Such a conventional wavelength-tunable laser light source module has a limited range of tunable wavelengths since the wavelength is controlled through the temperature. In addition, since the wavelength of the array is controlled using a single temperature controller, there is difficulty in independently controlling the wavelength of each light source. In addition, such a conventional wavelength-tunable laser light source module can change the wavelength of a light source only by using the temperature controller, and thus cannot be used as an uncooled light source. Accordingly, the price of the temperature controller and increased power consumption for temperature control are problems.

SUMMARY

The following description relates to a wavelength-tunable optical transmission apparatus capable of tuning a wavelength using a plurality of light sources.

The following description relates to a wavelength-tunable optical transmission apparatus for expanding a wavelength tuning range by using wavelength tunability of individual light sources of the plurality of light sources.

The following description relates to a wavelength-tunable optical transmission apparatus capable of independently controlling the wavelength of each light source.

The following description relates to a wavelength-tunable optical transmission apparatus that can be used as an uncooled light source.

Unlike the conventional wavelength-tunable technology that describes a wavelength tuning method, the following description relates to a wavelength-tunable optical transmission apparatus employing a wavelength tuning method and operations for electro-optic conversion that is used in optical communications.

These and other objects, features and advantages will be apparent from the following detailed description, the drawings, and the claims.

Figure 1:
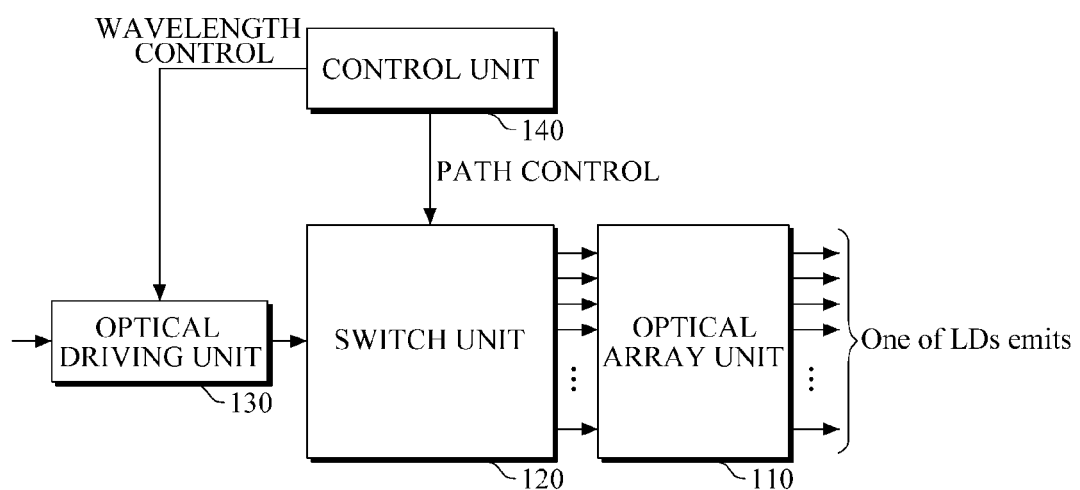
FIG. 1 is a block diagram illustrating a wavelength-tunable optical transmission apparatus in accordance with an example embodiment of the present disclosure.

Throughout the drawings and the detailed description, unless otherwise described, the same drawing reference numerals will be understood to refer to the same respective elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will suggest themselves to those of ordinary skill in the art. Also, descriptions of well-known functions and constructions may be omitted for increased clarity and conciseness. In addition, terms used herein are defined in consideration of functions in the present invention and may be changed according to the intention of a user or an operator or conventional practice. Therefore, the definitions must be based on content throughout this disclosure.

FIG. 1 is a block diagram illustrating a wavelength-tunable optical transmission apparatus in accordance with an example embodiment of the present disclosure.

Referring to FIG. 1, a wavelength-tunable optical transmission apparatus in accordance with an example embodiment of the present disclosure includes an optical array unit 110, a switch unit 120, an optical driving unit 130, and a control unit 140.

The optical array unit 110 includes a plurality of light sources driven by input current to convert an electrical signal into an optical signal. In accordance with an example embodiment of the present disclosure, each light source may be a laser diode (LD).

The optical array unit 110 may be provided as a single integrated chip or as individual chips of light sources that are physically integrated. Alternatively, the optical array unit 110 may be provided as individual forms of light sources that are physically integrated.

The light sources of the optical array unit 110 may operate at a single wavelength or at different wavelength depending on operating condition.

The optical array unit 110 may include the light sources that are tuned to wavelengths according to wavelength tuning parameters, such as, operating temperature, current, voltage, and temperature.

Each light source included in the optical array unit 110 may be tuned to a wavelength by individually changing wavelength tuning parameters, or the plurality of light sources of the optical array unit 110 may be simultaneously tuned to a wavelength.

In the case of the light array unit 110 provided as a single chip integrated with the light sources, the wavelength of the plurality of light sources can be simultaneously changed by controlling the temperature of the chip.

In addition, as the wavelength tuning parameter, input current for independent wavelength tuning may be used. However, in accordance with another example embodiment of the present disclosure, the wavelength tuning range of each of the light sources may be expanded by changing both the magnitude of current and the temperature.

For convenience of explanation, in the example embodiments, wavelength tuning through current control is taken as an example. However, aspects of the invention are not limited thereto, such that the wavelength tuning may be performed by controlling wavelength tuning parameters, such as, operating temperature, current, voltage, and temperature.

The optical driving unit 130 receives an electrical signal transmitted from an external circuit to generate bias current, and inputs the bias current to the optical array unit 110 through the switch unit 120.

The control unit 140 controls all functions required in the optical transmission apparatus. In accordance with an example embodiment of the present disclosure, the control unit 140 inputs a wavelength control signal to the optical driving unit 130 to control the wavelength of the optical array unit 110, thereby controlling the magnitude of current injected into the optical array unit 110. In the event where the wavelength tuning parameters are related to the optical array unit 110, the control unit 140 controls the optical array unit 110 to change the wavelength.

In addition, the control unit 140 inputs a path control signal to the switch unit 120, thereby controlling an on/off state of each light source forming the optical array unit 110.

That is, the optical transmission apparatus in accordance with an example embodiment of the present disclosure may change the wavelengths of light output using a plurality of light sources. The present disclosure is characterized in that in order to transmit a certain wavelength of light, both the optical driving unit 130 (or optical array unit 110) and the switch unit 120 are controlled by the control unit 140. In this case, since each light source has a wavelength tuning range, the entire wavelength tuning range can be expanded.

If each light source of the optical array unit 110 operates at the same wavelength, the wavelength can be changed by turning on or off the each light source or by the switch unit 120 that sets a path.

Generally, in an optical communication using wavelength multiplexing, a peak wavelength and an error thereof are determined, and thus wavelength tuning for wavelength stabilization at even a single wavelength is possible.

In accordance with an example embodiment of the present disclosure, the wavelength tuning ranges of the respective light sources of the optical array unit 110 may be set to be different from one another.

Figure 2:
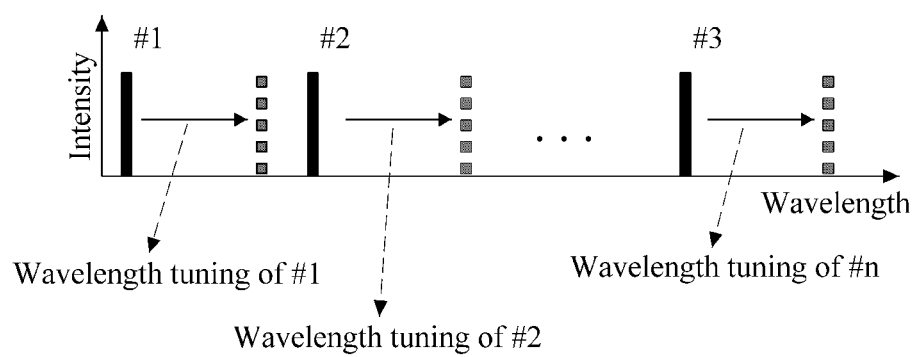
FIG. 2 is a diagram illustrating an arrangement of light source wavelengths in accordance with an example embodiment of the present disclosure.

FIG. 2 is a diagram illustrating an arrangement of light source wavelengths in accordance with an example embodiment of the present disclosure.

Referring to FIG. 2, when a wavelength tuning range of a single light source is X nm, a wavelength tuning range of a light source #1 may be set to be a~a+X nm, a wavelength tuning range of a light source #2 may be set to be a+X~a+2X nm, and a wavelength tuning range of a light source #n is set to be a+(n−1)X~a+nX nm. That is, when the number of light sources forming the optical array unit 110 is n, a wavelength tuning is achieved in a range of X*n nm. If each light source operates at one wavelength, it can be tuned to n different wavelengths.

To this end in the case of the optical array 110 provided as a single chip, each light source is set to have a different physical cavity length, so that wavelength tuning of each light source can be independently achieved. Since the wavelength tuning of each light source is independently achieved, n light sources may be used for n-channels. That is, the optical array unit 110 has a benefit of serving as a light source capable of outputting light corresponding to a wavelength of one channel, while serving as a multi-channel light source capable of outputting light corresponding to one or more channels.

If wavelength tuning of each light source is possible, the each light source can output light of the same wavelength or similar wavelength under the same conditions. In this case, each light source is controlled to output light of a different wavelength, so that the light sources can serve as a multi-channel light source.

In accordance with one example embodiment of the present disclosure, since the switch unit 120 is located between the optical driving unit 130 and the optical array unit 110, a signal propagation path becomes longer, and thus signal integrity (SI) is degraded. In order to make up for this shortcoming, another example embodiment of the present disclosure is suggested.

Figure 3:
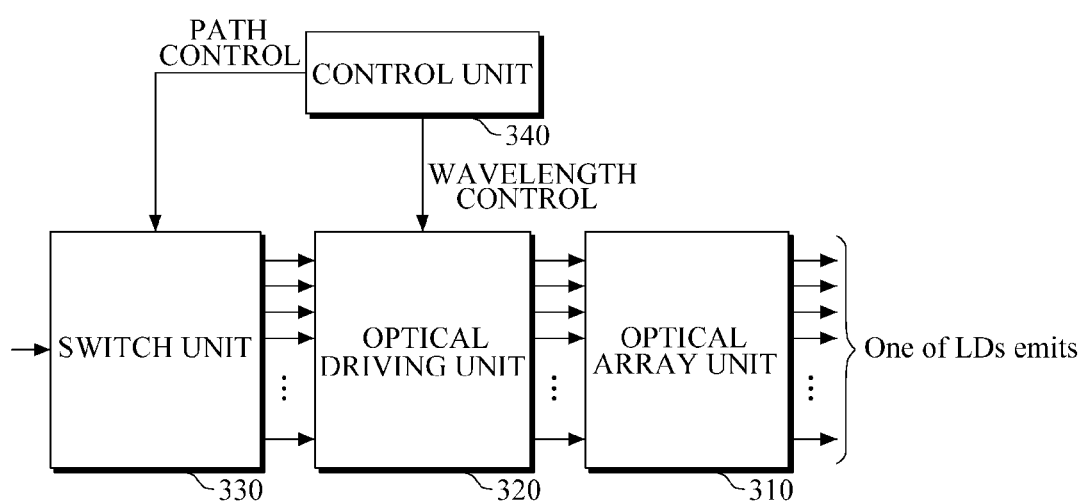
FIG. 3 is a block diagram illustrating a wavelength-tunable optical transmission apparatus in accordance with another example embodiment of the present disclosure.

FIG. 3 is a block diagram illustrating a wavelength-tunable optical transmission apparatus in accordance with another example embodiment of the present disclosure.

Referring to FIG. 3, a wavelength-tunable optical transmission apparatus includes an optical array unit 310, an optical driving unit 320, a switch unit 330 and a control unit 340. As compared to FIG. 1, in the example shown in FIG. 3, the switch unit 330 and the optical driving unit 320 are switched in their positions. Accordingly, the number of light sources of the optical array unit 310 and the number of drivers of the optical driving unit 320 should be equal to or greater than those in the example of FIG. 1.

As the operations and functions of the optical array unit 310 of FIG. 3 are the same as those of the optical array unit 110 of FIG. 1, the detailed description of the optical array unit 310 will not be reiterated.

The control unit 340 controls all functions required in the optical transmission apparatus to be performed. In accordance with an example embodiment of the present disclosure, the control unit 340 controls the magnitude of current injected from the optical driving unit 320 to the optical array unit 310. In the case where wavelength tuning parameters are related to the optical array unit 310, the control unit 340 controls the optical array unit 310. In addition, the control unit 340 controls the flow of current for each light source forming the optical array unit 310 by controlling the switch unit 330. That is, the optical transmission apparatus in accordance with an example embodiment of the present disclosure is characterized in that the wavelengths of light output using a plurality of light sources are changed, wavelength-tunable light is transmitted, and in order to transmit a certain wavelength of light, the optical driving unit 320 and the switch unit 330 are controlled by the control unit 340. In this case, each light source can have a wavelength tuning range, so that the entire wavelength tuning range can be expanded.

Each light source may operate at a single wavelength. If there are n light sources, the wavelength-tunable optical transmission apparatus for n wavelengths can be operated by a single light source.

In accordance with an example embodiment of the present disclosure, each light source forming the optical array unit 310 is set to have a different physical cavity length, so that wavelength tuning of each light source can be independently achieved. Since wavelength tuning of each light source is independently achieved, n light sources may be used for n-channels. That is, the optical array unit 310 can be used as a single channel light source outputting light corresponding to a wavelength of one channel, or as a multi-channel light source light capable of outputting light corresponding to more than one channel.

If each light source has a wavelength tuning range, n light sources may serve as n channels, regardless of the fact that the each light source outputs light of the same wavelength or a similar wavelength under the same conditions.

Figure 4:
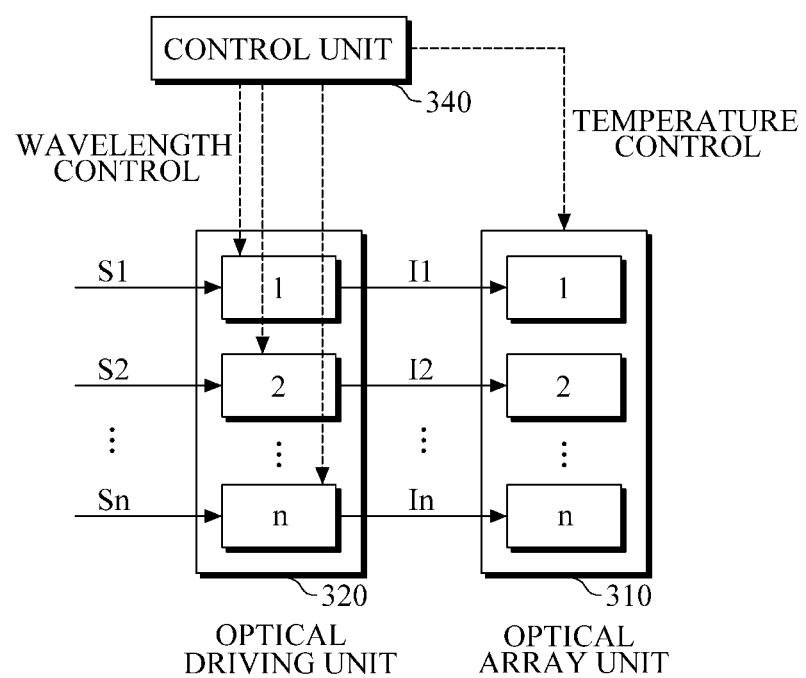
FIG. 4 is a diagram illustrating an optical driving unit and an optical array unit in accordance with another example embodiment of the present disclosure.

FIG. 4 is a diagram illustrating an optical driving unit and an optical array unit in accordance with another example embodiment of the present disclosure.

Referring to FIG. 4, the optical array unit 310 includes n light sources, and the optical driving unit 320 includes n optical driving elements configured to input current to the n light sources, respectively.

The respective optical driving elements of the optical driving unit 320 are switched on/off according to inputs of switch signals S1, S2, . . . and Sn. When switched on, each optical driving element of the optical driving unit 320 adjusts the magnitude of current to be input to the optical array unit 110 according to a wavelength control signal input from the control unit 340, and outputs the current.

Here, the control unit 340 may input a wavelength control signal to the optical driving unit 320 while inputting a light source control signal, e.g., a temperature control signal, to the optical array unit 310. That is, as described above, wavelength control is performed together with temperature control, thereby expanding the wavelength tuning range.

Figure 5:
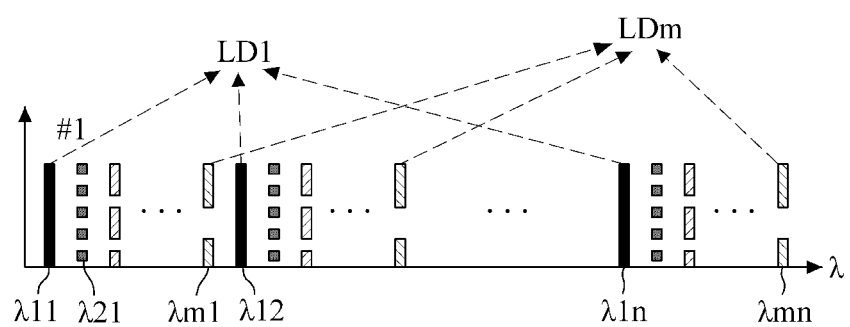
FIG. 5 is a diagram illustrating an arrangement of light source wavelengths in accordance with another example embodiment of the present disclosure.

FIG. 5 is a diagram illustrating an arrangement of light source wavelengths in accordance with another example embodiment of the present disclosure.

Referring to FIG. 5, the wavelength-tunable optical transmission apparatus operates with n independent wavelengths (n is at least one). In this case, since a broad range of wavelengths is provided using one type of light source, an inventory-associated drawback is resolved. For example, in a system having m x n wavelengths, if a single light source controls m wavelengths, that is, if a single light source performs wavelength tuning in a range of $\lambda mn$-$\lambda 1n$ or above, the number of required light sources is n. In detail, in a system using 32 (m×n) wavelengths, if a single LD performs wavelength tuning in a range corresponding to 8 (m) wavelengths, by using 4-(n) channel LD arrays, the inventory-associated drawback is resolved.

As is apparent from the above, wavelength tuning is possible through current without need of a temperature controller to change the temperature of the optical array, so that a simpler wavelength-tunable optical transmission apparatus is provided.

In addition, wavelength tuning parameters for each light source is independently controlled, so that independent wavelength control for each light source is possible.

In addition, in accordance with the configuration of the present disclosure, the wavelength-tunable light source can be used as a single light source as well as a multi-channel light source.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A wavelength-tunable optical transmission apparatus, comprising:
   a control unit;
   an optical array unit including a plurality of light sources that are each individually controllable via one of a plurality of light source control signals provided by the control unit;
   an optical driving unit including a plurality of optical driving elements that are each individually controllable to be switched on or off in accordance with one of a plurality of switch signals, each optical driving element being configured
      to generate current upon being switched on,
      to adjust the magnitude of the generated current in accordance with a wavelength control signal provided by the control unit, and
      to input the magnitude-adjusted current to the optical array unit for driving a corresponding one of the light sources; and
   a switch unit formed at an input terminal of the optical driving unit, the switch unit being configured to generate the plurality of switch signals in accordance with a path control signal provided by the control unit, to thereby switch on or off the plurality of optical driving elements, wherein the control unit is configured to
provide the wavelength control signal to said each optical driving element for adjusting the magnitude of the generated current in said each optical driving element,
provide the path control signal to said switch unit for generating the plurality of switch signals, and
provide the light source control signal to the plurality of light sources for controlling each of the light sources.

2. The wavelength-tunable optical transmission apparatus of claim 1, wherein each of the plurality of light sources is a laser diode (LD).

3. The wavelength-tunable optical transmission apparatus of claim 1, wherein each of the plurality of light sources has a working wavelength or a wavelength tuning range that is set to be different from the other light sources.

4. The wavelength-tunable optical transmission apparatus of claim 1, wherein in a case where a number of the light sources is n, one of the n light sources outputs an optical signal.

5. The wavelength-tunable optical transmission apparatus of claim 1, wherein in a case where a number of the light sources is n, and a wavelength tuning range of a single light source is X nm, the optical array unit performs wavelength tuning in a range of X*n nm.

6. The wavelength-tunable optical transmission apparatus of claim 1, wherein a wavelength of each of the plurality of light sources is changed by changing physical characteristic of a gain medium using current that is injected into the gain medium.

7. The wavelength-tunable optical transmission apparatus of claim 1, wherein wavelengths of the light sources are changed according to an operating temperature.

8. The wavelength-tunable optical transmission apparatus of claim 1, wherein wavelengths of the light sources are changed in accordance with a change in transmittance or reflectance properties of a wavelength tunable device.

9. The wavelength-tunable optical transmission apparatus of claim 1, wherein in a case where a number of the light sources is n, each of the n light sources outputs an optical signal.

10. The wavelength-tunable optical transmission apparatus of claim 1, wherein the light source is a wavelength-tunable laser.

11. The wavelength-tunable optical transmission apparatus of claim 1, wherein in a case where a number of the light sources for a system operating at m*n wavelengths is n, each light source performs wavelength tuning in a range corresponding to m wavelengths.

* * * * *